United States Patent [19]

Scifres et al.

[11] 4,347,611

[45] Aug. 31, 1982

[54] LARGE OPTICAL CAVITY (LOC) MESA LASER

[75] Inventors: Donald R. Scifres, Los Altos; Robert D. Burnham, Los Altos Hills; William Streifer, Palo Alto, all of Calif.

[73] Assignee: Xerox Corporation, Stamford, Conn.

[21] Appl. No.: 204,431

[22] Filed: Nov. 6, 1980

[51] Int. Cl.³ .................................................. H01S 3/19
[52] U.S. Cl. ......................................... 372/45; 357/17
[58] Field of Search .................... 331/94.5 H; 357/17, 357/18; 372/45, 46

[56] References Cited

U.S. PATENT DOCUMENTS 4,249,142  2/1981  Burnham et al. ................... 372/46
4,296,387  10/1981  Sugino et al. ......................... 372/45

Primary Examiner—James W. Davie
Attorney, Agent, or Firm—W. Douglas Carothers, Jr.

[57] ABSTRACT

In an injection laser of the type having a mesa provided on the substrate, at least one or more radiation confinement layers is provided in the laser and with the active layer form an enlarged optical cavity (LOC) for radiation propagation to focus the beam produced into a narrow index guided filament.

6 Claims, 4 Drawing Figures

LARGE OPTICAL CAVITY (LOC) MESA LASER

This invention relates to semiconductor injection lasers and particularly to improvements in focused refinement of the emitted beam from such lasers into a narrow index guided filament.

Higher power outputs are continually being sought in semiconductor junction lasers to meet requirements necessary for optical fiber transmission, optical disc writing and integrated optical components and circuits. To this end, control of single longitudinal mode selectivity and fundamental transverse mode operation have become of increasing interest. For example, fundamental transverse mode confinement and control would optimize the standing wave for greater power output useful in optical disc applications.

One of the most successful semiconductor lasers to date are the channel substrate lasers which have recently enjoyed some commercial success, offering stable single transverse and longitudinal mode operation. Examples of such lasers are found in U.S. Pat. Nos. 4,099,999 and 4,033,796 and assigned to the assignee herein.

Recently, mesa substrate lasers have received attention. These lasers may be compared to the channel substrate lasers as their antithesis, in that, in the substrate of former, a groove or channel is formed in the substrate top surface prior to epitaxial growth while in the substrate of the latter, a mesa is formed on the substrate top surface prior to epitaxial growth. In either case, epitaxial growths can be performed and controlled to produce desirable curvatures in the deposited layers over the channel or mesa. The curvature of these layers, referred to also as nonplanar, can greatly enhance the control of the single longitudinal mode selectivity, bring about fundamental transverse mode operation and reduce operating thresholds.

Examples of mesa lasers are found in U.S. Pat. No. 4,185,256 and U.S. patent application Ser. No. 74,685 filed Sept. 12, 1979, now U.S. Pat. No. 4,317,085 both assigned to the assignee herein, and in German Offenlegungsschrift No. 2,716,750.

It has been proposed to employ large optical cavities (LOC) in channel substrate lasers to improve the output beam. In these lasers, the emitting aperture tends to be fairly asymmetric. Cylindrical lenses are required to focus the laser beam to a spot so that the laser beam will be useful in optical applications, such as, optical disk recording and playback. The use of a single LOC, as disclosed in the previously identified patent application, or a double LOC, as disclosed in the article of Figueroa et al entitled, "Curved Junction Stabilized Filament (CJSF) Double-Heterostructure Injection Laser," Applied Physics Letters, 32(1), Jan. 1, 1978, are aimed at producing a more symmetrical radiation emitter and permit the employment of less expensive focusing lenses, such as spherical lenses, in desired optical applications.

SUMMARY OF THE INVENTION

According to this invention, the longitudinal and fundamental transverse mode operation of mesa injection lasers may be further improved by providing a large optical cavity (LOC) in these laser structures.

The LOC is produced by adding one or more medium index, radiation confining layers on either or both sides of the active layer. These layers, during epitaxial growth, become thicker on either side of the active layer in a region offset from the mesa. Means is incorporated into the laser structure to substantially confine the current to this region. Because of the extent of control over the largeness and geometric shape of these LOC regions, the quality obtained in beam focusing improved over the employment of LOCs in channel substrate lasers.

The improvement comprises at least one radiation confining layer provided between the active layer and one of the cladding layers generally contiguous with the active layer. The confining layer or layers have a bandgap and index of refraction intermediate of the bandgap and indices of refraction of the active layer and the cladding layers. The radiation confining layers form an enlarged optical cavity for the propagation of radiation created in the active layer and focus the beam produced into a narrow index guided filament. The enlarged cavity is formed by the added thickness of the radiation confining layers. In the case of liquid phase epitaxial (LPE) growth, this added thickness may take the form of an enlarged, substantially circular or arcuate shape.

A quantitative compositional difference in the materials comprising the radiation confining layer or layers and in the cladding layers can enhance higher order mode discrimination.

Other objects and attainments together with a fuller understanding of the invention will become apparent and appreciated by referring to the following description and claims taken in conjunction with the accompanying drawings.

DESCRIPTION OF THE PREFERRED EMBODIMENT

Figure 1:
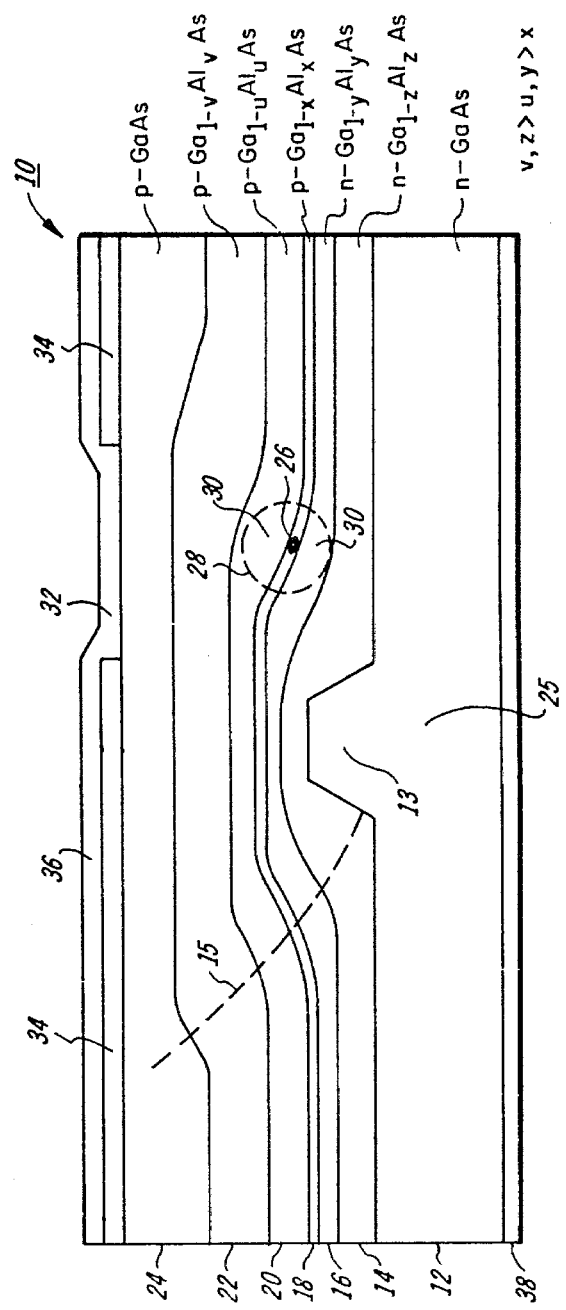
FIG. 1 is a front diagrammatic view of LOC mesa laser according to this invention having two radiation confining layers.

Referring to FIG. 1 LOC, mesa laser 10 comprises a substrate 12 of n-GaAs upon which several semiconductor layers are deposited. The mesa 13 is formed on the surface of the substrate 12 by preferential etching. Mesa 13 may, for example, be 2 $\mu$m in height. Layers 14–24 are epitaxially grown by liquid phase epitaxy (LPE), although these layers may also be deposited by molecular beam epitaxy (MBE) or metalorganic chemical vapor deposition (MO-CVD) as is the case in the laser structure shown in FIG. 5. These consecutively deposited layers are specifically, cladding layer 14 of n-Ga$_{1-z}$Al$_z$As, radiation confining layer 16 of n-Ga$_{1-y}$Al$_y$As, active layer 18 of p-Ga$_{1-x}$Al$_x$As, radiation confining layer 20 of p-Ga$_{1-u}$Al$_u$As, cladding layer 22 of p-Ga$_{1-v}$Al$_v$As and contact layer 24 of p-GaAs. The mole constituents are such that $v, z > u, y > x$. As an example, cladding layers 14 and 22 may be Ga$_{0.5}$Al$_{0.5}$As and confining layers 16 and 20 may be $Ga_{0.7}Al_{0.3}As$. Thus, the refractive index profile from layer 14 to 22 is low, medium, high, medium and low.

The compositional content of confining layers 16 and 20 need not be identical. In fact, asymmetric aluminum content in these two layers improves mode guiding. The higher ordered transverse modes are discriminated against while the fundamental transverse mode is more favored in its propagation. The asymmetric concept can also be extended to the cladding layers 14 and 22. For example, the aluminum content for layers 14 to 22 may be $z=0.40$, $y=0.30$, $x=0.05$, $u=0.50$ and $v=0.60$.

Current confinement means is provided in the form of a contact stripe 32, although other forms of current confinement known in the art may be employed. Stripe 32 is parallel with mesa 13 but displaced to one side thereof over the large optical cavity (LOC) region 28. The stripe 32 comprises the separated oxide layer 34 and metalization 32. The other contact for laser 10 is provided by the metalization 38.

Facet 25 is one of the two cleaved facets providing optical feedback. Operation of laser 10 is conventional On forward biasing the device by applying a current via contacts 32 and 38, carrier recombination will occur at the p-n junction at the boundary of active layer 18 in region 28 producing radiation propagating substantially in the confines of region 28 between the end facets. The spot 26 indicates the point of beam emission from laser 10.

Laser 10 is similar to structures in the previously mentioned prior art in that the bend or curvature in the layers below contact stripe 32 stabilize lateral waveguiding. The LOC region 28 comprises a section of the active layer 18 and two enlarged portions 30 formed in layers 16 and 20. This enlargement, defined generally by the dotted circle representing region 28, provides for optical confinement of the propagating radiation. Because of the presence of the mesa 13, the two confining layers 16 and 20 grow thicker on either side of the active layer 18 in region 28. Because these two medium index layers grow thicker adjacent to the active layer 18, they function to focus the light into a narrow index guided filament. Such a radiation filament is of the lowest order single transverse mode and is stable to several times the laser current threshold.

The propagating radiation "sees" a change in refractive index in this area because of the change in the thickness of layers. Each of the layers, including the active layer, have an enlargement region due to growth about the mesa 13, these regions being dissected by the curved dotted line 15 for purposes of illustration. The pumping of this region and the propagating radiation itself bring above changes in the effective index of refraction so that the radiation favors propagation in the enlarged LOC region 28.

The foregoing mentioned optical properties of the LOC in laser 10 is equally applicable to the remaining LOC mesa laser structures to be discussed.

Figure 2:
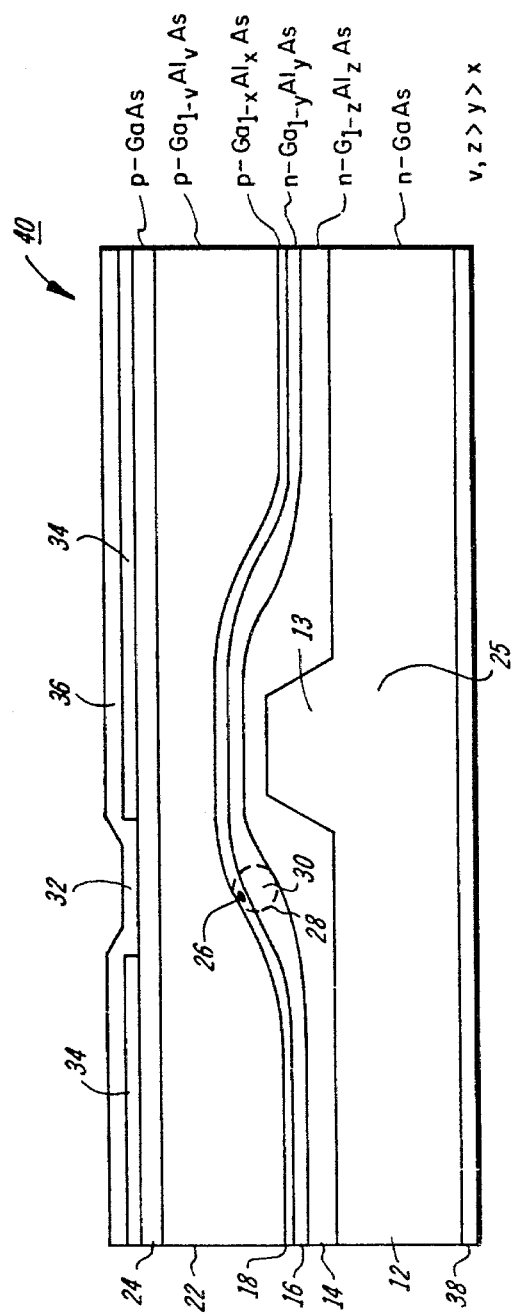
FIG. 2 is a front diagrammatic view of another LOC mesa laser according to this invention having one radiation confining layer contiguous with the surface of the active layer closest to the substrate of the laser.

Laser 40 in FIG. 2 is the same as laser 10 in FIG. 1 except radiation confining layer 20 has been omitted and the stripe geometry is on the opposite side of the laser relative to mesa 13. Here, the LOC region 28 is formed at the surface of active layer closest to substrate 12. Layer content may, for example, be $n-Ga_{0.5}Al_{0.5}As$ for cladding layer 14, $n-Ga_{0.7}Al_{0.3}As$ for confining layer 16, $p-Ga_{0.95}Al_{0.05}As$ for active layer 18, and $p-Ga_{0.55}Al_{0.45}As$ for cladding layer 22.

Figure 3:
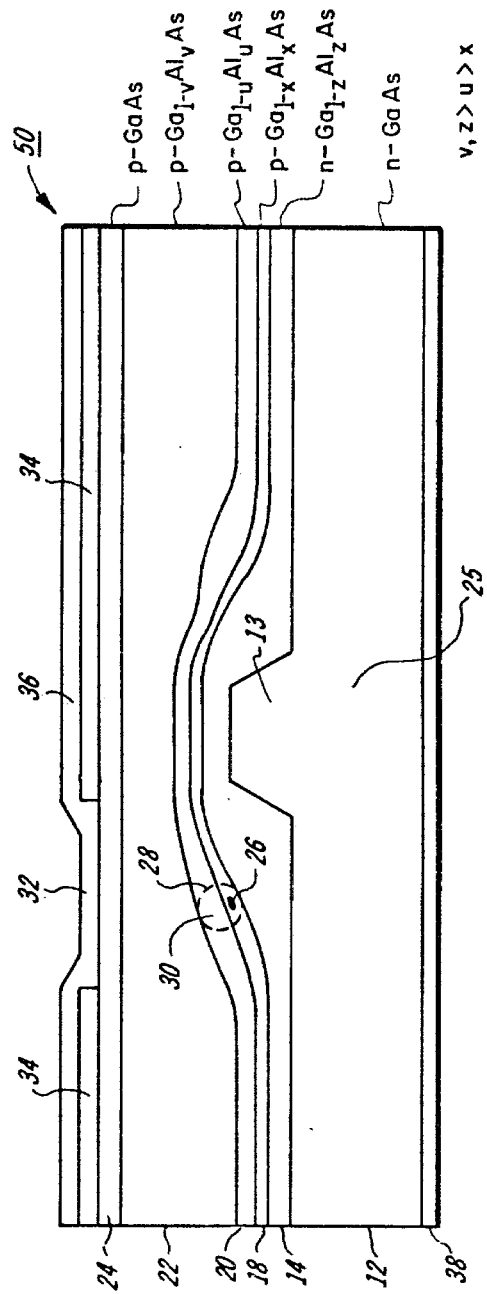
FIG. 3 is a front diagrammatic view of another LOC mesa laser according to this invention having one radiation confining layer contiguous with the surface of the active layer remote from the substrate of the laser.

Laser 50 in FIG. 3 is the same as laser 10 in FIG. 1 except radiation confining layer 16 has been omitted. Here, the LOC region is formed at the surface of the active layer remote from substrate 12. Layer content may, for example, be $n-Ga_{0.5}Al_{0.5}As$ for cladding layer 14, $n-Ga_{0.95}Al_{0.05}As$ for active layer 18, $p-Ga_{0.7}Al_{0.3}As$ for confining layer 20 and $p-Ga_{0.5}Al_{0.5}As$ for cladding layer 22.

Note that in both lasers 40 and 50, asymmetric aluminum content has been provided in certain of the confining or cladding layers immediately adjacent to the active layer 18, aiding in mode discrimination.

Figure 4:
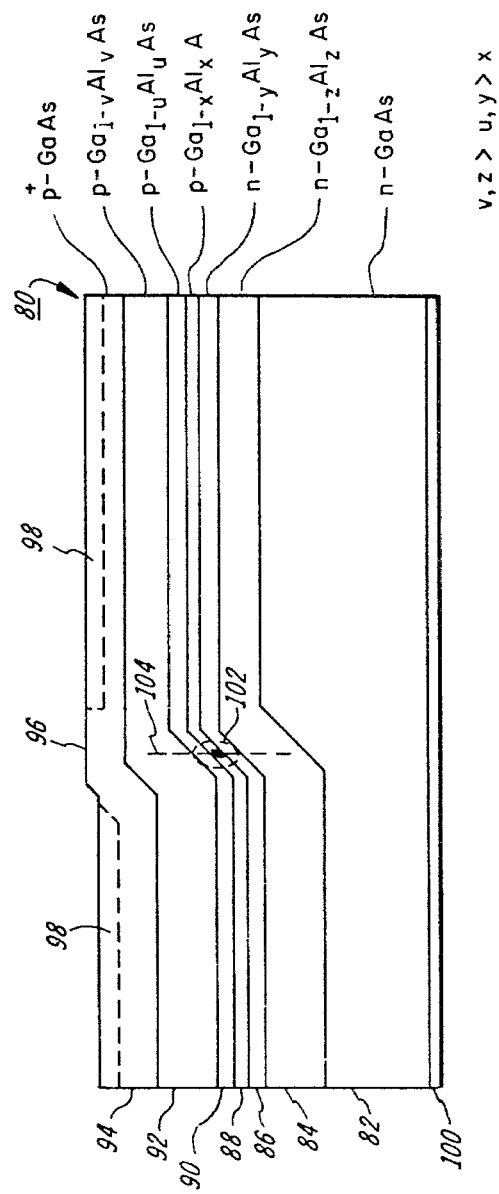
FIG. 4 is a front diagrammatic view of another LOC mesa laser according to this invention and is similar in structural geometry to the laser in FIG. 1 but fabricated by a different epitaxial growth process.

Laser 80 of FIG. 4 is similar in structural geometry to laser 10 in FIG. 1 but is fabricated by MBE or MO-CVD. Substrate 82 is provided with an etched mesa 83 upon which are epitaxially deposited layers 84-94. Layers 84-92 comprise the same constituents as layers 14-22 of laser 10.

Current confinement means for laser 80 comprises the additionally deposited layer 94 of heavy doped p+-GaAs, which is subsequently proton implanted in regions 98 to render them insulating. This forms the elongated contact 96 over the LOC region 102. Metalization 100 provides the other conventional contact.

Due to the nature of the epitaxial deposition in MBE and MO-CVD processes, the geometric contour of layers 84-94 will not be the same as in the case of LPE growth processes. The thicknesses of layers 86, 88 and 90 in region 102 will not be as large as in the thicknesses of the same layers in their adjacent planar regions. However, portions of these layers making up the LOC region 102 are nonplanar relative to the flow of current and established current density in the region such that the fundamental transverse mode is established at a diagonal in region 102 as represented by dotted line 104. This provides for a larger cavity than the cross-sectional thickness of the three layers 86-90, confining the fundamental mode to this region.

While the invention has been described in conjunction with specific embodiments, it is evident that many alternatives, modifications and variations will be apparent to those skilled in the art in light of the foregoing description. Accordingly, it is intended to embrace all such alternatives, modifications, and variations as fall within the spirit and scope of the appended claims.

For example, semiconducting crystalline materials, such as those containing In, Ga, Al, As, P, Sb, Pb, Sn and Te or other light emitting materials may be employed rather than GaAs:GaAlAs. Also, other means of current confinement known in the art may be employed instead of those shown in the figures.

Further, the thickness and compositions shown in the figures are intended to be only indicative of actual values. In practice, these thicknesses could be outside the suggested ranges in order to optimize a particular type of behavior of the device. Thus, for each laser design, it is necessary to calculate the necessary compositions and thicknesses to optimize a certain performance parameter.

What is claimed is:

1. In an injection laser having a plurality of contiguous semiconductor layers deposited on a semiconductor substrate, one of said layers fabricated to have a lower bandgap and higher refractive index than at least adjacent layers thereto to form an active layer for carrier recombination and radiation propagation under lasing conditions, cladding layers comprising said adjacent layers, an elongated mesa on the top surface of said substrate whereby during crystal growth of said semiconductor layers, said active layer and cladding layers will form about said mesa, means associated with said laser to confine current to a portion of said active layer, said current confinement means having a longitudinal extent parallel with the elongated extent of said mesa and being displaced therefrom whereby said radiation propagation and radiation emission from said laser occurs in and from a region in said active layer at the point of said displacement, the improvement comprising at least one radiation confining layer provided between said active layer and one of said cladding layers, said radiation confining layer having a bandgap and index of refraction intermediate of the bandgap and the indices of refraction of said active layer and said one cladding layer, said radiation confining layer forming a large optical cavity for the propagation of said radiation to focus the beam produced thereby into a narrow index guided radiation filament.

2. In the injection laser of claim 1 wherein there is a radiation confining layer provided on adjacent sides of said active layer between said active and cladding layers.

3. In the injection laser of either claim 1 or 2 wherein said cladding layer(s) possess a region of enlarged thickness adjacent to said active layer emission region.

4. In the injection laser of claim 2 wherein there is means in said radiation confining layers to produce a quantitative difference in their relative refractive indices.

5. In the injection laser of claim 4 wherein there is means in said cladding layers to produce a quantitative difference in their relative refractive indices.

6. In the injection laser of either claim 4 or 5 wherein said means comprises a compositional difference in the semiconductor material comprising said layers.

* * * * *